United States Patent
Lindahl et al.

(10) Patent No.: US 9,166,563 B2
(45) Date of Patent: Oct. 20, 2015

(54) ASYNCHRONOUS SAMPLE RATE CONVERTER

(71) Applicant: Actiwave AB, Solna (SE)

(72) Inventors: Erik Lindahl, Stockholm (SE); Pär Gunnars Risberg, Solna (SE)

(73) Assignee: Actiwave AB, Solna (SE)

( * ) Notice: Subject to any disclaimer, the term of this patent is extended or adjusted under 35 U.S.C. 154(b) by 0 days.

(21) Appl. No.: 14/354,146

(22) PCT Filed: Oct. 25, 2012

(86) PCT No.: PCT/EP2012/004473
§ 371 (c)(1),
(2) Date: Apr. 25, 2014

(87) PCT Pub. No.: WO2013/060463
PCT Pub. Date: May 2, 2013

(65) Prior Publication Data
US 2014/0313063 A1    Oct. 23, 2014

Related U.S. Application Data (60) Provisional application No. 61/551,158, filed on Oct. 25, 2011.

(51) Int. Cl.
*H03M 7/00* (2006.01)
*H03H 17/06* (2006.01)

(52) U.S. Cl.
CPC ....... *H03H 17/0628* (2013.01); *H03H 17/0614* (2013.01)

(58) Field of Classification Search
CPC .... H03H 17/0614; H03M 3/022; H03M 3/37; H03M 3/432; H03M 3/324; H03M 3/508
USPC .................... 341/61, 142, 143, 144
See application file for complete search history.

(56) References Cited

U.S. PATENT DOCUMENTS

| | | | |
|---|---|---|---|
| 5,712,635 A | 1/1998 | Wilson et al. | |
| 6,215,423 B1 | 4/2001 | May et al. | |
| 6,747,858 B1 * | 6/2004 | Sculley et al. | 361/61 |
| 6,819,725 B1 * | 11/2004 | Oliver et al. | 375/371 |
| 6,970,111 B1 * | 11/2005 | Sexauer et al. | 341/61 |
| 6,992,604 B2 * | 1/2006 | Miller et al. | 341/61 |

(Continued)

FOREIGN PATENT DOCUMENTS

EP    0 512 619 A1    11/1992

OTHER PUBLICATIONS

International Search Report issued in corresponding application No. PCT/EP2012/004473 mailed Apr. 9, 2013.

*Primary Examiner* — Linh Nguyen
(74) *Attorney, Agent, or Firm* — Carter, DeLuca, Farrell & Schmidt, LLP (57) ABSTRACT

An asynchronous sample rate converter and method for converting an input signal to a resampled output signal is disclosed. An efficient and cost-effective sample rate converter for converting an input signal of arbitrary sample rate to a resampled output signal of a second sample rate is disclosed. A hardware-efficient sample-rate converter for resampling an audio input signal with an arbitrary sample rate to an output audio signal with a known sample rate for use in an audio processor is disclosed.

20 Claims, 4 Drawing Sheets

(56) References Cited

U.S. PATENT DOCUMENTS

| | | | |
|---|---|---|---|
| 7,298,296 B1 * | 11/2007 | Kamath et al. | 341/61 |
| 7,408,485 B1 | 8/2008 | Yu et al. | |
| 7,477,170 B2 * | 1/2009 | Ananthaswamy | 341/61 |
| 7,733,151 B1 * | 6/2010 | Yu et al. | 327/291 |
| 8,554,817 B2 * | 10/2013 | Hu et al. | 708/313 |
| 8,737,532 B2 * | 5/2014 | Green et al. | 375/316 |
| 8,988,266 B2 * | 3/2015 | S et al. | 341/155 |
| 2006/0274858 A1 | 12/2006 | May | |
| 2009/0040085 A1 * | 2/2009 | Swain | 341/143 |
| 2011/0087347 A1 * | 4/2011 | Hammond et al. | 700/94 |
| 2014/0233744 A1 * | 8/2014 | Risberg et al. | 381/61 |

* cited by examiner

ASYNCHRONOUS SAMPLE RATE CONVERTER

BACKGROUND

1. Technical Field

The present disclosure is directed to a signal processor for converting a digital input signal to a digital output signal and, more particularly, to a signal processor with an asynchronous sample rate converter.

2. Background

Mobile technologies and consumer electronic devices (CED) continue to expand in use and scope throughout the world. In parallel with continued proliferation, there has been rapid technical advance of device hardware and components, leading to increased computing power and incorporation of new peripherals onboard a device along with reductions in device size, power consumption, etc.

Such devices must routinely handle a range of signal types (e.g. audio signals, video signals, sensory data, etc.), often arising from a variety of sources. In order to manage arbitrary signals, it is common for such systems to implement sample rate converters to convert from a first signal with an arbitrary sample rate to an alternative sample rate. Such sample rate conversions may be used to lower computational signal processing requirements, synchronize signal sampling with a system clock, operate with a minimum sample rate, convert to a known sample rate, etc.

Furthermore, the input signals are typically provided from different sources having their own reference clock that differs in frequency, or operates asynchronously from available system clocks. Even though the variation in frequency may be small, due to stability requirements and performance demands in many applications, the data streams must still be sample rate converted in order to maintain synchronization and signal integrity over long sample streams. Use of an intermediate sample rate may also eliminate problems with switching synchronization of signal sources. For example, when a signal processing system is synchronized to an input sample stream (rather than an independent or stabilized clock) and the sample stream clock changes, fluctuates, or is removed, "glitches" in generated output signals can occur.

Such problems as described above are of particular relevance to the areas of audio processing, video processing and telemetry applications.

SUMMARY

One objective of this disclosure is to provide an efficient and cost-effective sample rate converter for converting an input signal of arbitrary sample rate to a resampled output signal of a second sample rate. Another objective is to provide a sample rate converter for generating a resampled output signal with a stabilized sample rate from an input signal with an arbitrary sample rate. Yet another objective is to provide a hardware-efficient sample rate converter for resampling an audio input signal with an arbitrary sample rate to an output audio signal with a known sample rate for use in an audio processor. Another objective is to provide a sample rate converter for converting one or more input signals into multiple resampled output signals of optionally unrelated output sample rates, with substantially no additional hardware. Yet another objective is to provide an asynchronous sample rate converter for providing one or more outputs with variable (non-periodic) sample rates.

The above objectives are wholly or partially met by devices, systems, and methods according to the appended claims in accordance with the present disclosure. Features and aspects are set forth in the appended claims, in the following description, and in the annexed drawings in accordance with the present disclosure.

According to a first aspect there is provided, a sample rate converter for converting an input signal with a first sample rate to a resampled output signal with an output sample rate, including a cross enable unit, and a linear interpolation unit. The cross enable unit is configured to accept the input signal and produce one or more resampled clock signals and a de-jittered signal. The linear interpolation unit is configured to accept one or more resampled clock signals and the de-jittered signal, and to produce a resampled output signal at an output sample rate.

The cross enable unit may be configured to accept one or more input signals (e.g. a digital signal, a digital audio stream, a telemetry signal, etc.) from a signal source (e.g. output of an analog to digital converter, a signal processor, an SPDIF converter, an I2S converter, etc.) and to produce one or more resampled clocks and a de-jittered signal. The input signals may have one or more associated first sample rates. The cross enable unit may be configured to accept and/or to generate a clock signal (e.g. a system clock). The cross enable unit may be configured to produce one or more resampled clock signals, generated from one or more of the input signals in combination with the clock signal.

The sample rate converter may include a finite impulse response (FIR) filter module. The FIR filter module may be placed between the cross enable unit and the linear interpolation unit. The FIR filter module may be configured to produce a filtered intermediate signal from one or more of the resampled clock signals and the de-jittered signal. The linear interpolation unit may accept the filtered intermediate signal instead of the de-jittered signal.

In aspects, the sample rates of the resampled clock signals may be multiples of the averaged input sample rates (e.g. integer multiples, non-integer multiples, rational non-periodic variable multiples, etc.).

The resampled clock signals may be used by one or more of the units (e.g. the FIR filter module, the linear interpolation unit, etc.) within the sample rate converter to perform aspects of the sample rate conversion. The resampled clock signals may also be provided as outputs to other systems (e.g. for further signal processing, timing operations, parameter calculation, input signal quality assessment, etc.).

The cross enable unit may be configured to produce a de-jittered signal and associated de-jittered clock signal substantially sampled at the mean of the first sample rate. The de-jittered signal may be advantageous in applications where the input signal has a jittery, asynchronous, unreliable, or otherwise variable sample rate, as well as in applications where high performance demands are placed on signal processing aspects of the system.

In aspects, a cross enable unit in accordance with the present disclosure may include a counter, a FIFO buffer, an averaging block, a first sigma-delta loop, and/or a resampled clock generator. The counter may be configured to count the number of clock cycles on the clock signal between adjacent samples of the input signal to form a count-disparity signal. The FIFO buffer may be configured to store samples of the input signal and/or the count-disparity signal associated with each sample of the input signal for use by other blocks in the cross enable unit. The averaging block may be configured to calculate the moving average of the count-disparity signal to form an averaged count-disparity signal. The first sigma-delta loop may be configured to generate the number of clock cycles that should be inserted between samples at the desired resample rate from the averaged count-disparity signal. The resampled clock generator may be configured to construct one or more resampled clock signals (e.g. one or more intermediate clock signals, a de-jittered clock signal, etc.) from the output of the first sigma-delta loop. In addition or in combination, the de-jittered clock signal may be used as feedback to release corresponding input samples from the FIFO buffer at a de-jittered sample rate.

In aspects, the resampled clock generator may include a plurality of decimators each and/or collectively configured to generate one or more resampled clock signals (e.g. an integer division of the highest output sample rate, a non-integer division of the highest output sample rate, etc.).

In aspects, the de-jittered clock signal may be fed back into the FIFO buffer, the averaging block, and the first sigma-delta loop so as to synchronize calculations within the cross enable unit and provide a more stable rate than may be available from the input signal. This approach may be advantageous for improving system performance by substantially removing jitter induced error propagation that may otherwise pass along through a signal processing system, etc.

In aspects, the averaging block may include a moving average filter, a boxcar filter, combinations thereof, or the like. The filter may be configured to substantially reduce variability from the count-disparity signal, and/or to produce a stabilized numerical value representing the relationship between the first sample rate and the clock signal.

In aspects, the averaging block may include an averaging function with a non-unity DC gain adjustment configured to produce a non-unity representation of the count-disparity signal. Such an arrangement may be suitable for forming non-integer resampled rates on one or more of the resampled clock signals. In aspects, an adjustable gain may also serve as a feedback control signal to other elements of the cross enable unit (e.g. the FIFO buffer). In aspects, the averaging block may include a moving average filter with an adjustable gain parameter. The FIFO buffer may include a fill value proportional to the fill level of the FIFO buffer. The adjustable gain parameter may be controllably linked to the fill value. Thus the de-jittered sample rate may vary along with the fill level of the FIFO buffer, the relationship between parameters may be established such that the system is self-stabilizing, such that the FIFO buffer fills to a mid-point and remains at the mid-point during operation.

In aspects, the first sigma-delta loop may include one or more parameters suitable for modifying the count disparity value, and/or average count disparity value resampled temporal correction value. In one non-limiting example, the first sigma delta loop may include an integer value parameter, such as a power of 2 (e.g. 16). In another non-limiting example, the first sigma-delta loop may include a non-periodic, possibly random number generator (e.g. a pseudorandom Gaussian noise generator). Such a configuration may be advantageous for generating a spread spectrum sampling rate.

The cross enable unit may include several of the above elements (e.g. FIFO buffer, sigma-delta loops, averaging blocks, etc.) arranged so as to form a range of multi-rate resampled signals, non-integer resampled signals, etc.

The cross enable may further include a decimation unit for down sampling a signal to produce one or more resampled clock signals with a sample rate less than that of the input signal. Alternatively, additionally, or in combination, the cross enable unit may include a low pass filter (e.g. a linear phase filter, a FIR filter, etc.) configured so as to remove images from one or more signals in the cross enable. In aspects, image removal may be addressed by extending one or more coefficient sets in the low pass filter (i.e. an to form an adaptive image rejection filter) such that it may be configured to behave as a variable low pass filter through selection of one or more elements of the coefficient set. In aspects, one or more elements of the coefficient set may be selected depending on input-to-output sample rate selected in any particular application.

The cross enable may be adapted to simultaneously manage de-jittering and/or resampled clock signal generation for multiple asynchronous input signals. Such a configuration may be advantageous for sensor fusion applications where a common phase delay must be maintained between several, potentially multi-rate input signals obtained from a range of sensory inputs.

In aspects, the finite impulse response (FIR) filter module may be configured to accept one or more resampled clock signals and the de-jittered signal. The FIR filter module may be configured to produce a filtered intermediate signal at an intermediate sample rate corresponding to one of the resampled clock signals. The FIR filter module may include a FIR filter that samples the de-jittered signal at a rate corresponding to one of the resampled clock signals. The FIR filter may be configured as a low pass filter, a band-pass filter, combinations thereof, or the like. In one non-limiting example, the FIR filter may be implemented as a computationally efficient polyphase FIR filter.

In aspects, the FIR filter may be an adaptive and/or reconfigurable filter, the properties of which may be adjusted by an external system, by an adaptation algorithm, a parameter set, or the like. The reconfigurable filter parameters may be stored in the sample rate converter and/or may be updated externally or internally, potentially in real-time.

The resampled clock signal generator may accept reconfigurable parameters from an external source. Alternatively, in combination, or in addition, the resampled clock generator may include a non-periodic rate converting element (e.g. a pseudo random number generator, etc.). The non-periodic rate converting element may be used to create a spread spectrum sample rate, or the like. Such aspects may be advantageous for decreasing the peak electromagnetic radiation operably emitted from the sampling system, etc.

In aspects, the FIR filter may be implemented in a hardware descriptive language (HDL) to provide a structure with implicitly variable precision. A HDL implementation may be advantageous for simple inclusion of the sample rate converter into a signal processing application specific integrated circuit (ASIC), a digital signal processor (DSP), a field programmable gate array (FPGA), or the like.

In one non-limiting example, the FIR filter may include aspects of an inverse system model along with a low-pass function useful for removing aliasing artifacts from an up-sampled input signal. Such a FIR filter configuration may be advantageous for implementing a compensatory function with substantially minimized phase delay, improved computational efficiency, etc.

In aspects, the linear interpolation unit may be configured to accept one or more resampled clock signals and the de-jittered signal, the filtered intermediate signal, or a signal related thereto. The linear interpolation unit is configured to produce a resampled output signal at an output sample rate. The linear interpolation unit may include a filter element to remove aliasing artifacts from the signal after resampling to the output sample rate.

In aspects, the linear interpolation unit may include a second sigma delta loop configured to generate successive output samples from associated and/or adjacent samples of the filtered intermediate signal. The sigma delta loop may be configured to calculate a correction signal dependent on the sample rates of the resampled clock signals and filtered intermediate signal. In general, the correction signal may include an integer part and a remainder part. Upon each cycle at the output sample rate, the integer part of the correction signal may be added to the previous resampled output signal sample to form the current resampled output signal sample, while the remainder part may be added back into the correction signal to maintain integrity of the conversion process over time.

In aspects, the corresponding resampled output signal with an associated output sample rate may then be outputted from the sample rate converter for use elsewhere in a signal processing system, transfer to a PWM module, a transducer driver circuit, or the like.

According to another aspect, there is provided a sample rate converter for converting an asynchronous input signal at a first sample rate to one or more resampled output signals at variable (non-periodic) sample rates. The sample rate converter includes a cross enable unit, a linear interpolation unit and a FIR filter module each in accordance with the present disclosure. The cross enable unit may include a non-periodic signal generator, the output of which may be integrated into the re-sampling process (e.g. added into the count-disparity signal) to form a non-periodic resampled clock signal.

According to yet another aspect, there is provided a sample rate converter for converting an asynchronous input signal at a first sample rate to a resampled output signal with a substantially maximized sample rate. The sample rate converter includes a frequency synthesizer configured to produce, and/or means of receiving a clock signal (e.g. a high frequency system clock). The sample rate converter includes a cross enable unit configured accept the clock signal and the input signal, and to generate an count disparity signal and a de-jittered signal sampled at substantially the mean of the first sample rate, and a linear interpolation unit configured to generate the resampled output signal at the sample rate of the clock signal. The linear interpolation unit is configured to accept the de-jittered signal, the clock signal, and the count disparity signal. The linear interpolation unit includes a sigma-delta loop. The linear interpolation unit is configured to calculate the difference between successive samples of the de-jittered signal on each clock cycle of the de-jittered signal and input the difference into the sigma delta loop. The sigma delta loop is configured to divide the difference by the count disparity signal to form a correction signal. The correction signal has an integer part and a remainder part. The sigma delta loop is configured to add the integer part to the previous resampled output signal on each cycle of the clock signal so as to generate the current sample of the resampled output signal. The sigma delta loop is configured to recycle the remainder part into the correction signal for use on subsequent cycles (e.g to maintain a perfect conversion).

According to another aspect, there is provided a method for generating one or more resampled output signals with desired sample rates from one or more input signals and a clock signal. The method includes calculating a count-disparity signal from the input signal and the clock signal, the count-disparity signal relating to the difference in sampling rate between the clock signal and the input signal; generating a temporal correction signal from the count-disparity signal, the temporal correction signal corresponding to at least a portion of the desired sample rates; calculating one or more resampled clock signals using the temporal correction signal; and interpolating the input signals and/or one or more intermediate signals at sample rates corresponding with one or more of the re-sampled clock signals to form at least a portion of the resampled output signals.

The method may include a step of calculating one or more intermediate signals from the input signals and one or more of the re-sampled clock signals. The intermediate signals may be calculated by up-sampling and using a low pass filter, a FIR filter, a low pass polyphase FIR filter, combinations thereof, or the like.

Calculating a count-disparity signal may be accomplished by comparing the number of cycles of the clock signal between successive samples of the input signal.

Generating a temporal correction signal may be accomplished by using a first sigma delta loop in accordance with the present disclosure.

Calculating one or more re-sampled clock signals using the temporal correction signal may be accomplished by using a clock generator in accordance with the present disclosure.

Interpolating the input signals and/or one or more intermediate signals may be at least partially accomplished by using a second sigma delta loop in accordance with the present disclosure.

In aspects, the method may include filtering the count-disparity signal before calculating the temporal correction signal. The filtering may be accomplished by a low pass filter, a moving average filter, a low pass polyphase FIR filter, combinations thereof, or the like.

In aspects, the method may include adding a non-periodic signal to the count-disparity signal. Such a non-periodic signal may be provided by a random number generator, a thermal number generator, etc. Such a non-periodic addition may be advantageous to form one or more spread spectrum resampled output signals.

According to aspects there is provided, an audio processor for processing an audio stream, including a sample rate converter in accordance with the present disclosure, the sample rate converter configured to resample the audio stream.

According to aspects there is provided, use of a sample rate converter in accordance with the present disclosure to process an audio stream, a data stream and/or a video stream.

BRIEF DESCRIPTION OF THE DRAWINGS

Several aspects of the disclosure can be better understood with reference to the following drawings. In the drawings, like reference numerals designate corresponding parts throughout the several views.

DETAILED DESCRIPTION

Particular embodiments of the present disclosure are described hereinbelow with reference to the accompanying drawings; however, the disclosed embodiments are merely examples of the disclosure and may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. Like reference numerals may refer to similar or identical elements throughout the description of the figures.

Some aspects described herein are associated with "arbitrary" sampling rates (e.g., arbitrary source or destination sampling rates). As used here, the term "arbitrary" may refer to any sampling rate that is not pre-determined (e.g., that is not known when a sample rate conversion system is designed).

Moreover, as used herein lowercase variables will declare sequences in the time domain, while uppercase variables will declare frequency representations (e.g., x is a sequence represented in the time domain while X is the same variable represented in the frequency domain). The subscript n is used to represent the time index of sequences in the time domain (e.g. $x_n$). Different subscript letters are used to represent different sample rates related to a time index of sequences in the time domain (e.g. $x_n$, $y_b$, $z_k$, etc.).

Figure 1:
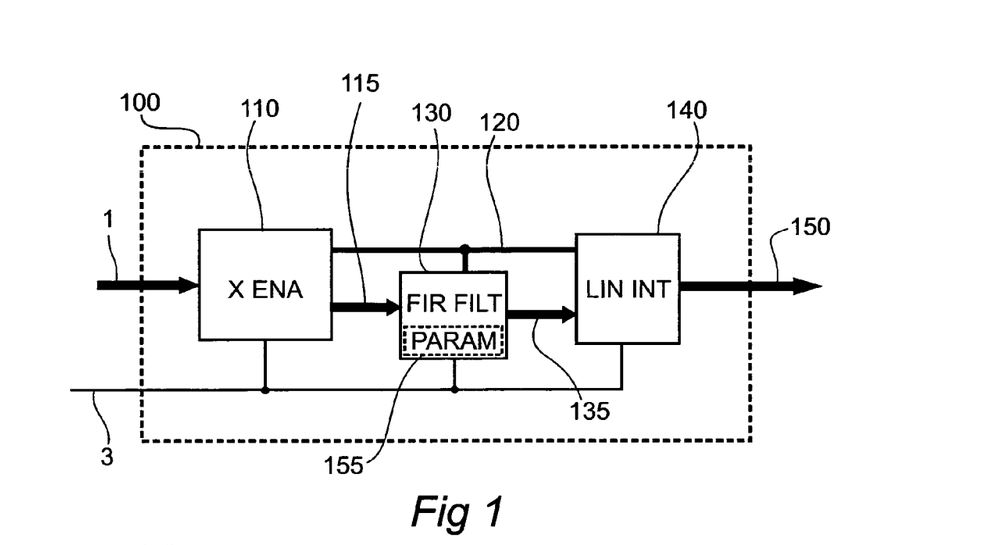
FIG. 1 shows a sample rate converter in accordance with the present disclosure.

FIG. 1 shows a sample rate converter 100 in accordance with the present disclosure. The sample rate converter 100 is adapted for converting an input signal 1 with a first sample rate to a resampled output signal 150 with an output sample rate, and includes a cross enable unit 110, a finite impulse response (FIR) filter module 130, and a linear interpolation unit 140. The sample rate converter 100 may be configured to accept, or generate internally a clock signal 3 that may be used during the conversion process. The cross enable unit 110 is configured to accept the input signal 1 and produce one or more resampled clock signals 120 and a de-jittered signal 115. The FIR filter module 130 may be configured to produce a filtered intermediate signal 135 from one or more of the resampled clock signals 120, optionally the clock signal 3, and the de-jittered signal 115. The linear interpolation unit 140 may be configured to accept one or more resampled clock signals 120 and the filtered intermediate signal 135, and to produce the resampled output signal 150 at an output sample rate.

Although FIG. 1 shows a single input signal 1, de-jittered signal 115, filtered intermediate signal 135, and resampled output signal 150, multiple signals may be considered within the spirit of the disclosure and signals may often be referred to in singular or plural form as particular to the discussion at hand.

Although FIG. 1 shows a FIR filter module 130 connected between the cross enable unit 110 and the linear interpolation unit 140, in one non-limiting example, the FIR filter module 130 may be removed and the de-jittered signal 115 connected directly to the linear interpolation unit 140 without altering the scope of the disclosure. In this example, the linear interpolation unit 140 may be configured to accept the de-jittered signal 115 directly instead of the filtered intermediate signal 135.

The cross enable unit 110 may be configured to accept one or more input signals 1 (e.g. a digital signal, a digital audio stream, a telemetry signal, etc.) from a signal source (e.g. output of an analog to digital converter, a signal processor, an SPDIF converter, an I2S converter, etc.), and to produce one or more resampled clock signals 120 and a de-jittered signal 115. The input signals 1 have one or more associated first sample rates. The cross enable unit 110 may also accept and/or generate internally a clock signal 3 (e.g. a system clock). The cross enable unit 110 may be configured to produce one or more resampled clock signals 120, generated from one or more of the input signals 1 in combination with the clock signal 3.

In aspects, the clock signal 3 may have a significantly higher sample rate than the input signal 1, the resampled output signal 150 or intermediate signals generated during the conversion process. The clock signal 3 may be generated by a frequency synthesizer, a PLL, an RC oscillator, a crystal oscillator, combinations thereof, or the like.

In aspects, the sample rates of the resampled clock signals 120 may be preconfigured multiples of the averaged input sample rates (e.g. integer multiples, non-integer multiples, rational non-periodic variable multiples, etc.), associated with the input signals 1. Alternatively, one or more of the resampled clock signals may be deterministically related to the clock signal 3 so as to provide a known sample rate irrespective of shifts and/or fluctuations in the first sample rate.

The resampled clock signals 120 may be used by one or more of the units (e.g. the FIR filter module 130, the linear interpolation unit 140, etc.) within the sample rate converter 100 to perform aspects of the sample rate conversion. The resampled clock signals 120 may also be provided as outputs to other systems (e.g. for further signal processing, timing operations, parameter calculation, input signal quality assessment, etc.).

In aspects, the cross enable unit 110 may be configured to produce a de-jittered signal 115 and an associated de-jittered clock signal (e.g. a resampled clock signal 120) substantially sampled at the mean value of the first sample rate. The de-jittered signal 115 may be advantageous in applications where the input signal 1 has a jittery, asynchronous, unreliable, or otherwise variable first sample rate, as well as in applications where high performance demands are placed on signal processing aspects of the system.

In aspects, the FIR filter module 130 may include a FIR filter (not explicitly shown) and one or more parameters 155 for adjusting the properties of the FIR filter. The FIR filter may be configured as a low pass filter, a band-pass filter, or the like. In one non-limiting example, the FIR filter may be implemented as a computationally efficient low pass polyphase FIR filter. The FIR filter may be an adaptive and/or reconfigurable filter, the properties of which may be adjusted by an external system, by an adaptation algorithm, the parameters 155, or the like. In one non-limiting example, the parameters 155 may be reconfigurable filters, may be stored in the sample rate converter and/or may be updated externally or internally, potentially in real-time.

In aspects, the cross enable unit 110 and/or the FIR filter module 130 may include a low pass filter (e.g. a linear phase filter, a FIR filter, etc.) configured so as to remove images from one or more signals in the cross enable. In aspects, image removal may be addressed by extending one or more coefficient sets in the low pass filter (i.e. an to form an adaptive image rejection filter) such that it may be configured to behave as a variable low pass filter through selection of one or more elements of the coefficient set. In aspects, one or more elements of the coefficient set may be selected depending on input-to-output sample rate selected in any particular application.

Figure 2:
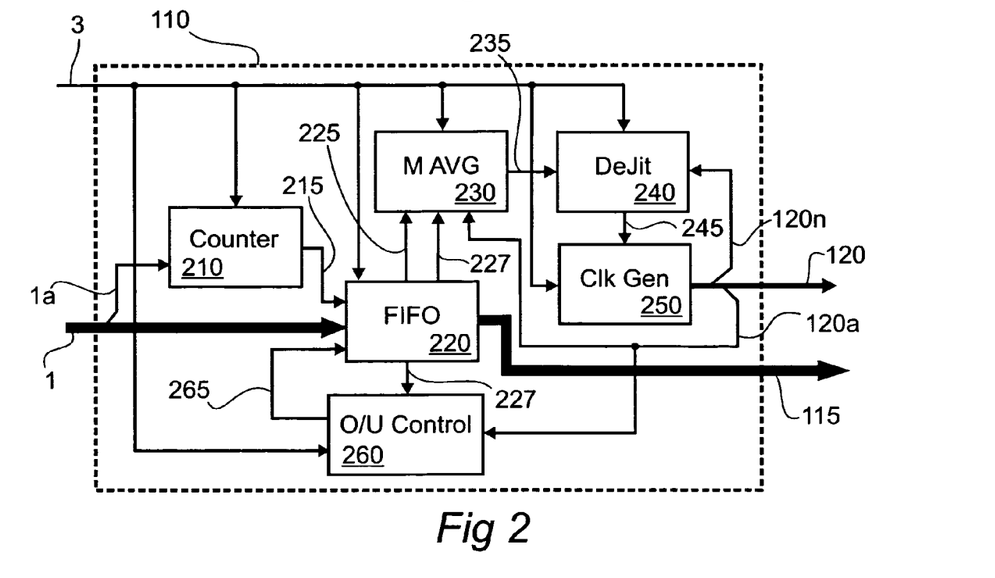
FIG. 2 shows a cross enable unit in accordance with the present disclosure.

FIG. 2 shows a cross enable unit 110 in accordance with the present disclosure. The cross enable unit 110 includes a counter 210, a FIFO buffer 220, an averaging block 230, a first sigma-delta loop 240, a resampled clock generator 250, and a FIFO fill control 260 (equivalently included within the FIFO buffer 220). The counter 210 may be configured to count the number of clock cycles on the clock signal 3 between adjacent samples of the input signal 1 to form a count-disparity signal 215. The counter 210 may be configured to accept the input signal 1 directly and/or an input signal enable bit 1*a* (as shown).

The FIFO buffer 220 may be configured to store samples of the input signal 1 and/or the count-disparity signal 215 associated with each sample of the input signal 1 for use by one or more blocks in the cross enable unit 110. The FIFO buffer 220 may be configured to deliver count disparity signal 225 to the averaging block 230. The FIFO buffer 220 may also be configured to generate a fill value 227 that corresponds to how full the FIFO buffer 220 is with count disparity signal 225 and/or corresponding samples of the input signal 1.

The averaging block 230 may be configured to calculate the moving average of the count disparity signal 225 to form an averaged count-disparity signal 235. The averaging block 230 may include a FIR filter, boxcar average, an infinite impulse response (IIR) low pass filter, combinations thereof, or the like to achieve this functionality. The first sigma-delta loop 240 may be configured to accept the clock signal 3, the averaged count-disparity signal 235 and/or one or more intermediate clock signals 120*n* (as feedback from the resampled clock generator 250). From these inputs, the first sigma delta loop 240 may be configured to generate the number of clock cycles that should be inserted between input samples at the desired resample rate from the averaged count-disparity signal 235 to form a temporal correction signal 245. The resampled clock generator 250 may be configured to accept the temporal correction signal 245, the clock signal 3, or the like, and to construct one or more resampled clock signals 120 (e.g. one or more intermediate clock signals 120*n*, a de-jittered clock signal 120*a*, etc.).

In addition or in combination, the de-jittered clock signal 120*a* may be used as feedback to release corresponding input samples from the FIFO buffer 220 at a de-jittered sample rate.

The FIFO fill control 260 may be configured to generally keep the FIFO buffer 220 from under or over flowing during operation. To achieve this function, the FIFO fill control 260 may be configured to accept a fill value 227 from the FIFO buffer 220, the de-jittered clock signal 120*a*, and the clock signal 3, and/or calculate a fill rate parameter 265. The fill rate parameter 265 may be used to advantageously time the release of samples into the FIFO buffer 220 to prevent under or over filling.

In aspects, the FIFO fill control 260 may be included in the average block 230 or between the FIFO buffer 220 and the average block 230. The FIFO fill control 260 may be configured to alter the count disparity signal 225 associated with each released audio sample before supplying it to the averaging block 230. The FIFO fill control 260 may be configured to alter the count disparity signal 225 based on the fill level of the FIFO buffer 220. When the FIFO buffer 220 is half full, the FIFO fill control 260 may be configured to maintain the count disparity signal 225 about a steady value. This way the FIFO fill control 260 may be configured to speed up or slow down to maintain the FIFO buffer 220 at a desired fill level.

The de-jittered clock signal 120*a* may be fed back to the FIFO fill control 260, into the FIFO buffer 220, the averaging block 230, and the first sigma-delta loop 240 as a trigger to synchronize calculations within the cross enable unit 110 and provide a more stable sample rate for signal processing than may be available from the input signal 1 directly. This approach may be advantageous for improving system performance by substantially removing jitter induced error propagation from the input signal 1 that may otherwise pass along through a signal processing system, etc.

In aspects, the first sigma delta loop 240 may be configured to accept the averaged count-disparity signal 235 from the averaging block 230 and to generate a number of clock cycle transitions to wait between one or more resampled clock signals for the resampled clock generator 250. In general, the first sigma delta loop 240 may be configured to output the number of clock cycle transitions to be inserted between the highest resampled clock rate in the system. The first sigma delta loop 240 may be configured to retain this information as an internal value, which may include an integer part and a remainder part. The integer part may be delivered to the resampled clock generator 250 in the form a temporal correction value 245, while the remainder part may be internally cycled to be spread across subsequent samples. In this way, the first sigma delta loop 240 may be configured to spread the asynchronous aspects of the signal conversion over several samples while performing substantially a perfect conversion in an averaged time sense.

In aspects, the resampled clock generator 250 may be configured to accept the temporal correction value 245 commonly related to the maximum resampled clock rate in the system and to generate one or more resampled clock rates 120 for use by one or more units in the system. The resampled clock generator 250 may include an integer divider, a non-integer divider, combinations thereof, or the like.

Figure 3:
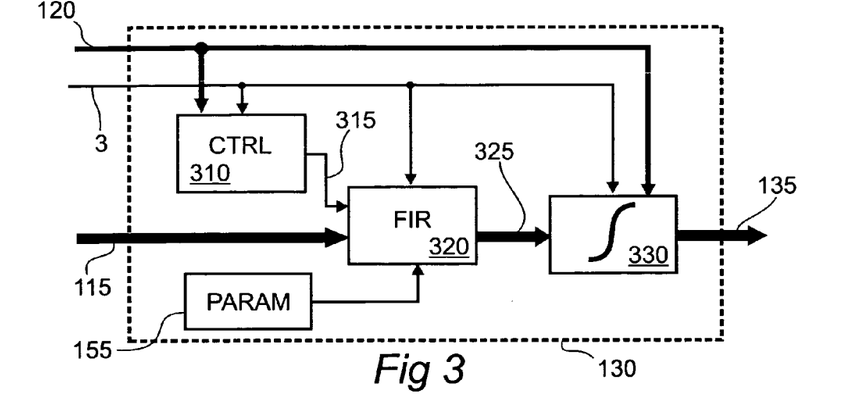
FIG. 3 shows a finite impulse response filter in accordance with the present disclosure.

FIG. 3 shows a FIR filter module 130 in accordance with the present disclosure. The FIR filter module 130 includes a controller 310, a FIR filter 320 and limiter 330. The FIR filter module 130 may be configured to accept a clock signal 3, one or more de-jittered signals 115, one or more resampled clock signals 120, or the like. The FIR filter module 130 may be configured to produce one or more filtered intermediate signals 135. The controller 310 may be configured to accept the clock signal 3 and one or more resampled clock signals 120 and to produce an intermediate clock signal 315 to drive the FIR filter 320. The FIR filter 320 may be configured to accept one or more de-jittered signals 115 at a sample rate determined by the intermediate clock signal 315 and to produce a first filtered signal 325. The limiter 330 may be configured to accept the first filtered signal 325 and to implement a saturation function to prevent overflow of the signal. The limiter 330 may be configured to output one or more filtered intermediate signals 135.

The FIR filter module 130 may include one or more parameters 155. The parameters 155 may be used to configure coefficients of the FIR filter 320 and/or the limiter 330.

Figure 4:
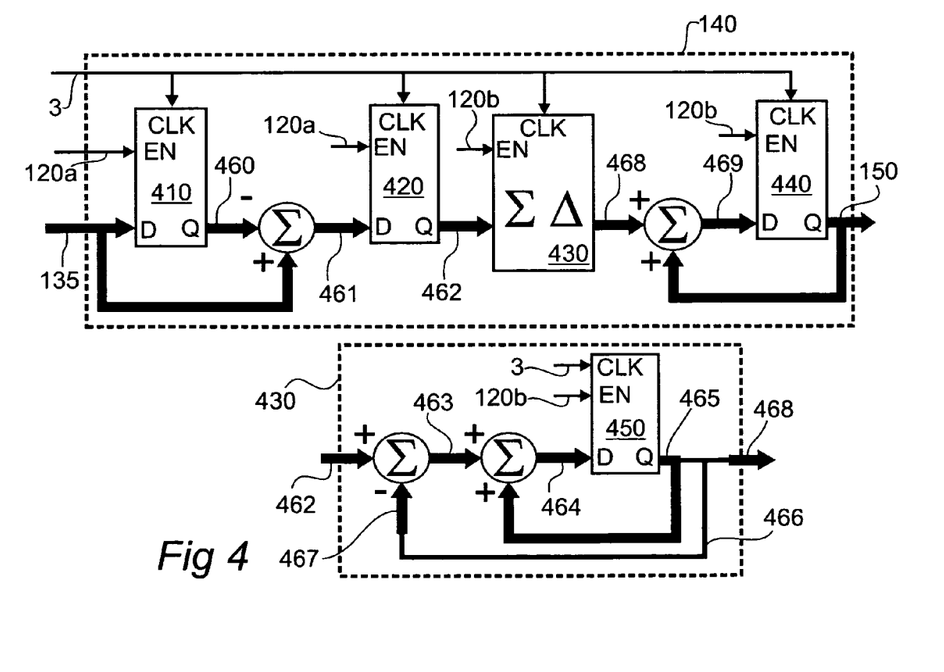
FIG. 4 shows a linear interpolation unit and a sigma delta block in accordance with the present disclosure.

FIG. 4 shows a linear interpolation unit 140 in accordance with the present disclosure, configured to accept one or more filtered intermediate signals 135, a clock signal 3, and one or more resampled clock signals 120*a-b*, and to produce a resampled output signal 150 at an output sample rate.

The linear interpolation unit 140 may include one or more registers 410, 420, 440 to store a signal. The clock signal 3 may be provided to each of the registers 410, 420, 440 and a sigma delta loop 430 within the linear interpolation unit 140 as a timing source. As shown in FIG. 4, the filtered intermediate signal 135 may be stored in the register 410 on each cycle of the first resampled clock signal 120*a*, to form a delayed signal 460. The delayed signal 460 may be subtracted from the filtered intermediate signal 135 to form a difference signal 461. The difference signal 461 may be stored in the register 420 on each cycle of the first resampled clock signal 120*a*. The stored difference signal 462 may be sampled by the sigma delta loop 430 on every cycle of the second resampled clock signal 120*b*. The sigma delta loop 430 may be configured to produce an output incremental signal 468 on each cycle of the second resampled clock signal 120b. The output incremental signal 468 may be added to the resampled output signal 150 on each cycle of the second resampled clock signal 120b to form an intermediate output signal 469 that is stored in a register 440, the intermediate output signal 469 also being stored on each cycle of the second resampled clock signal 120b. Thus the linear interpolation unit 140 may be configured to generate a resampled output signal 150 at an output sample rate.

FIG. 4 also shows an example of the sigma delta loop 430 in accordance with the present disclosure. The sigma delta loop 430 may be configured to accept a clock signal 3 and the second resampled clock signal 120b. On each cycle of the second resampled clock signal 120b the sigma delta loop 430 may be configured to sample the stored difference signal 462 and to subtract from it a remainder signal 467 representing an integer portion of the correction signal 465 to produce first SDL intermediate signal 463, which may be added to the correction signal 465, the result being the second SDL intermediate signal 464, which is then stored in the register 450 on each cycle of the second resampled clock signal 120b. The correction signal 465 may be divided by a predetermined value (dependent on the desired output sample rate) to create an integer part 466. In aspects, the integer part 466 may be generated by a power of 2 division (e.g. division by 32), which is achieved by a bit shift. In a non-limiting example, where the goal is to provide a maximally re-sampled output signal, this division rate is real time variable that is updated with every sample of the input signal 1. The integer part 466 may be converted to an appropriate precision to create the output incremental signal 468 on every cycle of the second resampled clock signal 120b.

In aspects, the linear interpolation unit 140 may include a second sigma delta loop 430 configured to generate successive output samples from associated and/or adjacent samples of the filtered intermediate signal 135. The sigma delta loop 430 may be configured to calculate the correction signal 465 on each cycle of the second resampled clock signal 120b. In general, the correction signal may include 465 an integer part 466 and a remainder part (shown as a portion of the second SDL intermediate signal 464). Upon each cycle of the second resampled clock signal 120b, the output incremental signal 468 may be added to the previous sample of the resampled output signal 150 to generate the current resampled output signal sample, while the remainder part may be fed back into the sigma delta loop to maintain integrity of the conversion process over time.

Figure 5:
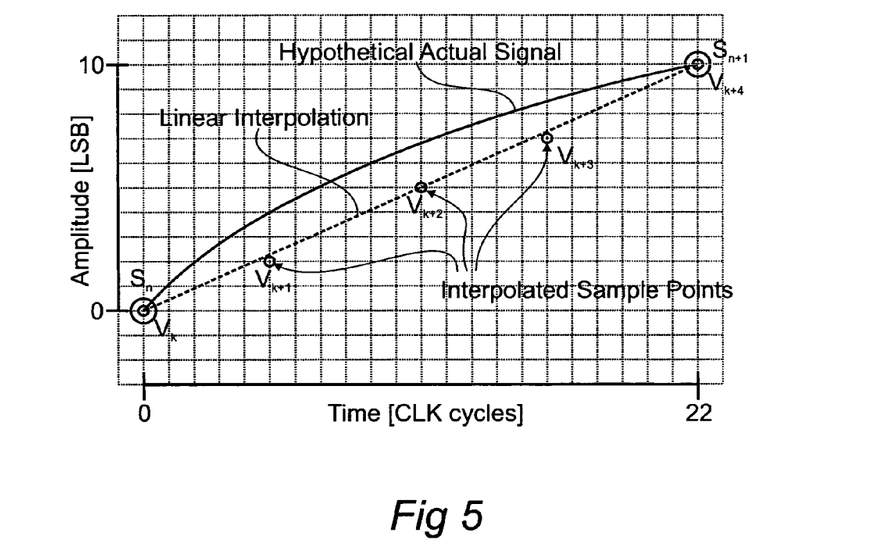
FIG. 5 shows a time series graph outlining the conversion of consecutive input samples of an input signal to a resampled output signal in accordance with the present disclosure.

FIG. 5 shows a time series chart of a non-limiting example to demonstrate the combined effect of the first sigma delta loop and the second sigma delta loop. The time axis is divided into cycles of the clock signal 3. In this, non-limiting example the FIR filter module 130 is configured at unity sample rate and as such does not influence the system response. The amplitude axis is divided into least significant bits, representing the desired precision of the signal. In this example, 22 clock cycles are shown. The time series of the input signal is represented by successive samples $s_n$ and $s_{n+1}$. In this non-limiting example, the input samples $s_{n+1}$ and $s_n$ are separated by 22 clock cycles. The time series of the resampled output signal is represented by successive samples $v_k$ to $v_{k+4}$.

The first sigma delta loop generates the temporal spacing of series k from the temporal time series n and the desired ratio between the series k and series n sample rates (in this case an integer value, 4). As seen in FIG. 5, the resampled output signal samples are spaced at 5, 6, 5, and 6 clock cycles respectively. The second sigma delta loop generates the amplitudes of the output samples from the input samples and the ratio between the sample rates of the input signal and resampled output signal. As seen in FIG. 5, the output sample amplitudes are 2, 5, 7 and 10 respectively. The function of the sigma delta loops is further elucidated below:

TABLE 1

| Sigma Delta Example: Both sigma delta loops with interpolation factor of 4: | |
|---|---|
| First sigma delta loop (temporal) | Second sigma delta loop (amplitude) |
| Sample time difference is: $T\_Diff = T_{n+1} - T_n = 22$ $T\_DiffDiv = T\_Diff/4 = 5.5$ Thus, the time should be incremented by 5.5 CLK cycles for every new interpolated sample to spread them evenly between the samples $s_{n+1} - s_n$. To synchronize output with the clock signal, the sigma delta will generate samples only at integer values, and spread the truncation error over samples. Output clock cycles to wait between samples generated by the first sigma delta: $v_{k+1}$: 5 $v_{k+2}$: 6 $v_{k+3}$: 5 $s_{n+1}$: 6 | Sample amplitude difference is: $S\_Diff = s_{n+1} - s_n = 10$ $S\_DiffDiv = S\_Diff/4 = 2.5$ Thus the signal amplitude should be incremented by 2.5 amplitude steps for every new interpolated sample to spread them evenly between $s_{n+1} - s_n$. To keep the system precision equal to the input signal, the sigma delta will only generate integer values for each increment, and spread the truncation error over the samples. Output increment generated by the second sigma delta: $v_{k+1}$: 2 $v_{k+2}$: 3 $v_{k+3}$: 2 $s_{n+1}$: 3 |

Overlaid onto the chart are curves depicting a hypothetical actual signal (solid line) and an ideal linear interpolation (dotted line). As can be seen in FIG. 5, the interpolated sample points $v_{k+1}$ to $v_{k+3}$ approximate the linear interpolation both in amplitude and in time. The first sigma delta loop ensures that the conversion is time perfect, in that the remainder from each approximation is maintained in the loop for contribution to subsequent samples. Similarly, the sub LSB amplitude variations of the second sigma delta loop are maintained as remainders for contribution to successive samples.

Figure 6:
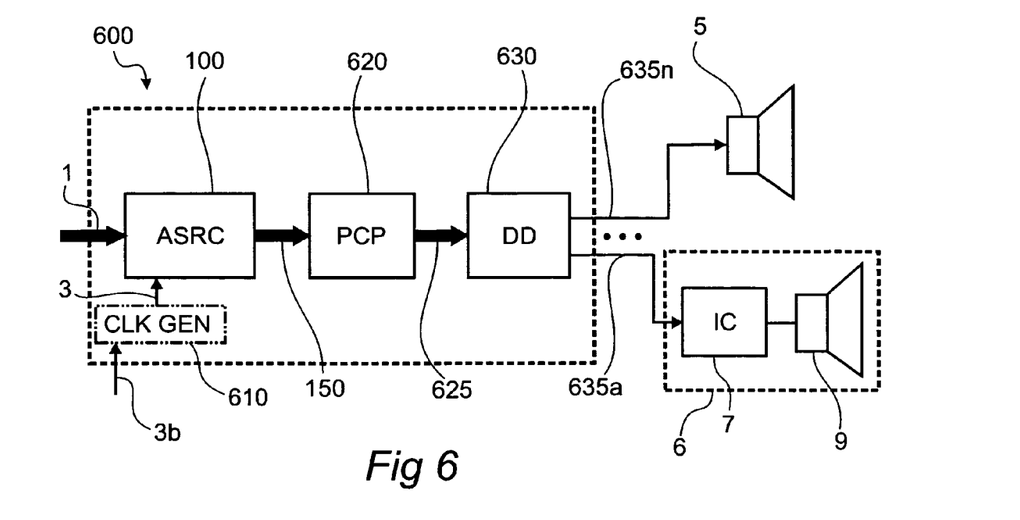
FIG. 6 shows a signal processing system for an audio application with an integrated sample rate converter in accordance with the present disclosure.

FIG. 6 shows an audio enhancement system 600 for an audio application with an integrated sample rate converter in accordance with the present disclosure. The audio enhancement system 600 includes a parametrically configurable processing (PCP) block 620, an asynchronous sample rate converter (ASRC) 100 and a digital driver (DD) block 630. The audio enhancement system 600 may be configured to accept one or more audio input signals 1 from an audio source. In the schematic shown, the ASRC 100 may be configured to accept the input signal 1 and to produce a resampled output signal 150. The resampled output signal 150 may be provided to the PCP block 620 which produces an enhanced signal 625. The DD block 630 may be configured to convert the enhanced signal 625 into one or more audio output signals 635a-n, suitable for driving a transducer 5 or a transducer module 6. The transducer module 6 may include a driver integrated circuit 7 and a transducer 9.

The audio enhancement system 600 may further include a clock generator 610 that may generate a clock signal 3 internally or accept a system clock signal 3b from an external clock source. The clock signal 3 may be supplied to any block in the audio enhancement system 600, but particularly to the ASRC 100, wherein it is used to compute the resampled output signal 150.

Figure 7:
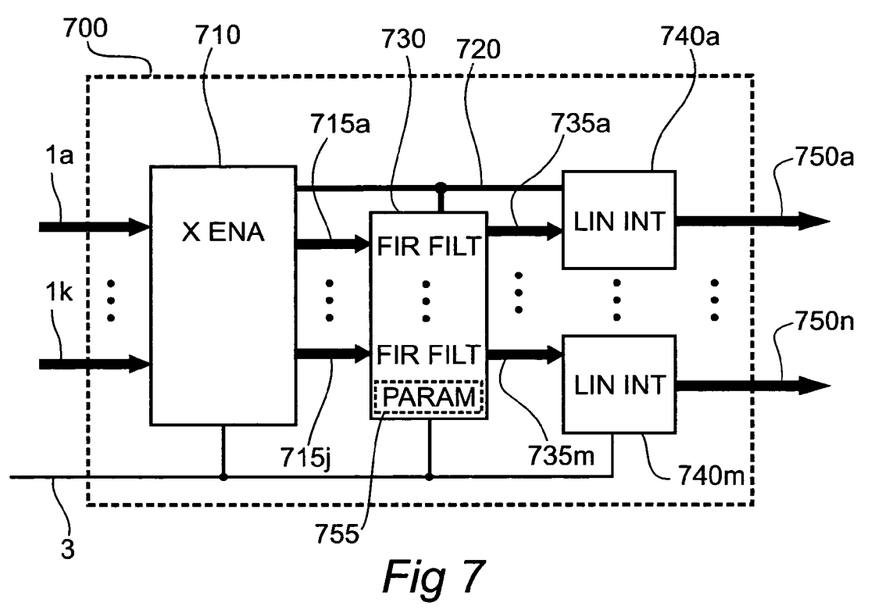
FIG. 7 shows a multi-signal sample rate converter in accordance with the present disclosure.

FIG. 7 shows a multi-input multi-output (MIMO) sample rate converter 700 including a cross enable unit 710, a FIR filter module 730 and a plurality of linear interpolation units 740a-m. The MIMO sample rate converter 700 may be configured to accept a plurality of inputs 1a-k and a clock signal 3. The clock signal 3 may be directed to one or more aspects of the system and may be used throughout the MIMO sample rate converter 700 as a stable and known time piece.

The cross enable unit 710 may be configured to accept a plurality of input signals 1a-k and the clock signal 3, and to generate a plurality of de-jittered signals 715a-j and one or more resampled clock signals 720. The de-jittered signals 715a-j may be sampled about the averaged sample rates of the corresponding input signal 1a-k. The resampled clock signals 720 may be generated at integer or non-integer multiples of the corresponding input signal 1a-k sample rates. One or more of the resampled clock signals 720 may correspond to a non-integer or integer division of the clock signal 3.

In aspects, the FIR filter module 730 may include a plurality of FIR filters (e.g. low pass polyphase FIR filters), and optionally one or more parameters 755. The parameters 755 may be used to configure the FIR filters, etc. The FIR filter module 730 may be configured to accept a plurality of de-jittered signals 715a-j, one or more resampled clock signals 720, the clock signal 3, combinations thereof, or the like, and to produce a plurality of filtered intermediate signals 735a-m. The FIR filters may be arranged in parallel, acting separately upon associated de-jittered signals 715a-j or may be configured as MIMO filters, adapted to act simultaneously upon several de-jittered signals 715a-j. The filtered intermediate signals 735a-m are generally resampled and filtered versions of the associated de-jittered signals 715a-j. The FIR filter module may be configured to provide such resampling functionality without significantly imparting phase distortion to the signals.

The linear interpolation units 740a-m may be configured to accept the filtered intermediate signals 735a-m, the resampled clock signals 720 and the clock signal 3, combinations thereof, or the like. The linear interpolation units 740a-m may be configured to generate the plurality of resampled output signals 750a-n at the desired output sample rates. The linear interpolation units 740a-m may include one or more sigma-delta loops for providing the interpolation function.

EXAMPLE

In one non-limiting example, the cross enable unit includes a FIFO buffer suitable for storing 16 successive samples. The cross enable unit includes a counter that counts the number of clock cycles between each input sample, thus forming a count-disparity signal updated at the input sample rate. The counter sends the count-disparity signal to the FIFO buffer. The input sample corresponding to the associated count-disparity sample may be stored together within the FIFO buffer. This may be used to keep everything in sync as signals are passed through the cross enable unit signal train.

The averaging block includes an $8^{th}$ order moving average filter, to compute average count-disparity values from the successive count-disparity samples stored in the FIFO buffer. Thus the output of the averaging block is a stabilized count-disparity signal representative of the difference between the clock signal sample rate and the averaged input sample rate. The averaged count-disparity signal is then input to the first sigma-delta loop. The first sigma-delta loop accepts the count-disparity signal at the averaged de-jittered sample rate, in combination with the desired resampling rates to form a temporal correction value. In this, non-limiting example, the cross enable unit produces a first resampled clock signal with a sample rate of 16× of the averaged input sample rate, a second resampled clock signal with a sample rate of 512× the averaged input sample rate, and a de-jittered clock signal with a sample rate of 1× the averaged input sample rate. Thus, the sigma-delta loop temporal correction value is formed by dividing the averaged count-disparity values by 512 (in this case a bit shift of 9 bits).

The integer and remainder portions of the temporal correction value are separated within the first sigma-delta loop. The integer portion of the temporal correction value is sent to the resampled clock generator, which uses this value to insert the appropriate number of clock cycles between successive samples of the 512× resampled clock signal. The remainder portion of the temporal correction value is retained and successively added back into the temporal correction value, to retain a perfect conversion. The resampled clock generator provides feedback to the first sigma-delta loop once every sample of the 512× resampled clock signal in order to trigger iteration of the first sigma-delta loop.

The resampled clock generator constructs one or more resampled clock signals from the temporal correction values and the clock signal. In this, non-limiting example, the resampled clock generator forms a 512× resampled clock signal as well as a 16× and a 1× resampled clock signal. The 16× and 1× resampled clock signals are formed via decimation of the 512× resampled clock signal. The 1× resampled clock signal is the de-jittered clock signal and may be used as feedback within the sample rate converter in order to trigger events in each block at a substantially stabilized sample rate.

Continuing with this, non-limiting, example, the FIR filter module accepts the 1×, 16×, and resampled clock signals along with the de-jittered signal. The FIR filter module includes a low pass polyphase FIR filter that up samples the de-jittered signal to the 16× resampled rate.

An L-branch polyphase FIR filter transfer function of order N may be calculated as follows:

$$Q(z) = \sum_{m=0}^{L-1} z^{-m} E_m(z^L) \quad \text{Equation 1}$$

where $$E_m(z) = \sum_{n=0}^{\frac{N+1}{L}} h[Ln+m] z^{-m} \quad \text{Equation 2}$$

and h[n]=0 for n>N and where h[n] are coefficients of the FIR filter. The particular coefficients may be determined during the design process, configured during operation by a real-time process (such as a real-time control algorithm), and/or configured by a set of preconfigured parameters, which may be uploaded to the sample rate converter by a firmware upgrade, as control parameters accompanying a data stream, during first power on by a consumer, or the like.

Thus the FIR filter module generates a filtered intermediate signal at the 16× resampled rate. The linear interpolation unit accepts the filtered intermediate signal as well as the 16× and 512× resampled clock signals and the clock signal. The linear interpolation unit includes a second sigma delta loop into which the difference between successive filtered intermediate samples $s_{n+1}$ and $s_n$ is divided by the resample rate (in this case 32), to form a correction signal. The correction signal is interpreted as having an integer part and a remainder part. For each successive sample of the filtered intermediate signal, the output is computed as follows. Starting from $s_n$ the output is updated at each 512× resampled clock cycle. The integer part of the correction signal is added to the resampled output signal at each 512× resampled clock cycle and the remainder part of the correction signal is recycled back into the correction signal for use in successive samples. Thus the resampled output signal is constructed in a very computationally efficient manner.

It will be appreciated that additional advantages and modifications will readily occur to those skilled in the art. Therefore, the disclosures presented herein and broader aspects thereof are not limited to the specific details and representative embodiments shown and described herein. Accordingly, many modifications, equivalents, and improvements may be included without departing from the spirit or scope of the general inventive concept as defined by the appended claims and their equivalents.

What is claimed is:

1. A sample rate converter for converting an input signal sampled at an input sample rate to an output signal sampled at an output sample rate different from the input sample rate, the sample rate converter comprising:
   a clock source for generating and/or accepting a clock signal;
   a counter configured to generate a count-disparity signal from the clock signal and the input signal;
   a first sigma delta loop configured to calculate a temporal correction value from the count-disparity signal;
   a resampled clock generator configured to generate one or more resampled clock signals from the temporal correction value; and
   a second sigma delta loop configured to generate the output signal from one or more of the resampled clock signals and the input signal,
   wherein the second sigma delta loop generates an incremental output signal on every cycle of a resampled output signal, and
   wherein the incremental output signal is added to the output signal to generate the output signal at the output sample rate.

2. The sample rate converter in accordance with claim 1, further comprising a FIFO buffer coupled to the counter and the input signal and configured to store successive samples of the input signal and the count-disparity signal.

3. The sample rate converter in accordance with claim 2, further comprising a FIFO fill controller coupled to the resampled clock generator and the FIFO buffer and configured to control a fill level of the FIFO buffer about a desired target fill level.

4. The sample rate converter in accordance with claim 3, further comprising an averaging block coupled to the counter or the FIFO buffer and configured to calculate an averaged count-disparity signal from the count-disparity signal,
   wherein the first sigma delta loop is coupled to the averaging block and configured to accept the averaged count-disparity signal.

5. The sample rate converter in accordance with claim 4, wherein the averaging block includes a moving average filter configured to calculate the averaged count-disparity signal.

6. The sample rate converter in accordance with claim 1, wherein the resampled clock generator is further configured to resample the input signal to form a de-jittered signal having a substantially stabilized sample rate.

7. The sample rate converter in accordance with claim 6, comprising a low pass filter coupled to the resampled clock generator and the second sigma delta loop, configured to accept one or more of the resampled clock signals and the input signal or the de-jittered signal, and configured to calculate a filtered intermediate signal,
   wherein the second sigma delta loop is further configured to accept the filtered intermediate signal.

8. The sample rate converter in accordance with claim 7, wherein the low pass filter is a low pass polyphase FIR filter.

9. A sample rate converter for converting an input signal sampled at an input sample rate to an output signal sampled at an output sample rate different from the input sample rate, the sample rate converter comprising:
   a clock source for accepting a clock signal;
   a cross enable unit configured to generate one or more resampled clock signals and a de-jittered signal from the input signal and the clock signal; and
   a linear interpolation unit configured to generate the output signal from the de-jittered signal, the clock signal, and one or more of the resampled clock signals,
   wherein the linear interpolation unit includes:
      at least one register configured to store the input signal to form a delayed signal on every cycle of a first resampled clock signal; and
      a first sigma delta loop configured to generate an incremental output signal on every cycle of a second resampled clock signal based on the delayed signal, and
   wherein the incremental output signal is added to the output signal to generate the output signal at the output sample rate.

10. The sample rate converter in accordance with claim 9, further comprising a FIR filter module configured to generate a filtered intermediate signal from the de-jittered signal, the clock signal, and one or more of the resampled clock signals,
    wherein the FIR filter module includes a low pass filter, and
    wherein the linear interpolation unit is further configured to accept the filtered intermediate signal.

11. The sample rate converter in accordance with claim 10, wherein the low pass filter is a low pass polyphase FIR filter.

12. The sample rate converter in accordance with claim 10, wherein the FIR filter module further includes a limiter configured to prevent overflow of the filtered intermediate signal.

13. The sample rate converter in accordance with claim 9, wherein the cross enable unit includes:
    a counter configured to generate a count-disparity signal from the clock signal and the input signal;
    a second sigma delta loop configured to calculate a temporal correction value from the count-disparity signal; and
    a resampled clock generator configured to generate the one or more resampled clock signals from the temporal correction value.

14. The sample rate converter in accordance with claim 13, wherein the cross enable unit further includes a FIFO buffer configured to store samples of the count-disparity signal and input signal and to release samples to the second sigma delta loop.

15. The sample rate converter in accordance with claim 9, wherein the cross enable unit includes:
    a counter configured to generate a count-disparity signal from the clock signal and the input signal;
    an averaging block configured to generate an averaged count-disparity signal from the count-disparity signal;
    a second sigma delta unit configured to calculate a temporal correction value from the averaged count-disparity signal; and
    a resampled clock generator configured to generate the one or more resampled clock signals from the temporal correction value.

16. The sample rate converter in accordance with claim 15, wherein the cross enable unit further includes a FIFO buffer, configured to store samples of the count-disparity signal and the input signal and to release the samples to the averaging block.

17. The sample rate converter in accordance with claim 15, wherein the averaging block includes a moving average FIR filter configured to at least partially calculate the averaged count-disparity signal.

18. A method for generating an output signal with an output sample rate from an input signal with an input sample rate different from the output sample rate and a clock signal, the method comprising:

calculating a count-disparity signal from the input signal and the clock signal, the count-disparity signal relating to a difference in sampling rate between the clock signal and the input signal;

generating a temporal correction signal from the count-disparity signal, the temporal correction signal corresponding to at least a portion of the output sample rate;

calculating a re-sampled clock signal using the temporal correction signal; and interpolating the input signal at the output sample rate corresponding with the re-sampled clock signal to form the output signal at the output sample rate, wherein interpolating the input signal includes:

storing the input signal on every cycle of a first resampled clock signal to form a delayed signal;

generating an incremental signal on every cycle of a second resampled clock signal based on the delayed signal; and adding the incremental signal to the output signal on every cycle of the second resampled clock signal to generate the output signal at the output sample rate.

19. The method in accordance to claim 18, further comprising filtering the count-disparity signal before calculating the temporal correction signal.

20. The method in accordance with claim 18, further comprising adding a non-periodic signal to the count-disparity signal.

\* \* \* \* \*